United States Patent [19]

Sugibayashi

[11] Patent Number: 4,984,205

[45] Date of Patent: Jan. 8, 1991

[54] SEMICONDUCTOR MEMORY DEVICE WITH IMPROVED INDICATOR OF STATE OF REDUNDANT STRUCTURE

[75] Inventor: Tadahiko Sugibayashi, Tokyo, Japan

[73] Assignee: NEC Corporation, Tokyo, Japan

[21] Appl. No.: 329,612

[22] Filed: Mar. 28, 1989

[30] Foreign Application Priority Data

Mar. 28, 1988 [JP] Japan ................................ 63-73993

[51] Int. Cl.$^5$ .............................................. G11C 7/00
[52] U.S. Cl. ................................ 365/200; 365/230.06
[58] Field of Search ................... 365/200, 201, 230.06; 371/10.3, 21.1

[56] References Cited

U.S. PATENT DOCUMENTS 4,392,211  7/1983  Nakano et al. ...................... 365/200
4,463,450  7/1984  Haeusele ............................ 365/200

Primary Examiner—Joseph A. Popek
Attorney, Agent, or Firm—Sughrue, Mion, Zinn, Macpeak & Seas

[57] ABSTRACT

A semiconductor memory device having a redundant cell array and provided with an improved indicating circuit of the selection state of the redundant cell array is disclosed. The memory device comprises a tri-state type output circuit for generating read-out data from the selected memory cell at an output terminal, a detection circuit for generating a detection signal when the memory cell of the redundant cell array is selected and a control circuit for disenabling the output circuit thereby to make the output terminal at a high impedance state in response to the detection signal.

4 Claims, 3 Drawing Sheets

SEMICONDUCTOR MEMORY DEVICE WITH IMPROVED INDICATOR OF STATE OF REDUNDANT STRUCTURE

BACKGROUND OF THE INVENTION

1. Field of the Invention:

The present invention relates to a semiconductor memory device having a redundant structure and, more particularly to a semiconductor memory device having means for indicating the state of the redundant structure of the device.

2. Description of the Related Art:

In a semiconductor memory device, a plurality of memory cells are arranged in a matrix form of rows and columns. The possibility of defects generated in a semiconductor memory device during the manufacture thereof has been increased in accordance with the increase in memory capacity of the memory device. Therefore, the higher the memory capacity or integration density of the device, the greater the number of the defective memory cells. However, even if the device includes only one defective memory cell, the device cannot be operated normally and, the device must be abandoned.

In order to save such a memory device having a small number of defective memory cells, a redundant structure has been employed in which a defective memory cell or cells in a normal memory cell array are functionally replaced by a redundant memory cell or cells of a redundant memory cell array. Thus, the manufacturing yields can be improved in the semiconductor memory device by the redundant technique.

In such a semiconductor memory device incorporating the redundant structure, from the point of view of quality control, it is important to know whether or not the redundant structure such as a redundant memory cell array is actually being used. It is also important to know the address of the normal memory cell array replaced by the redundant memory cell array in view of defect analysis and function test. On approach for indicating the status of the redundant cell array is to provide a so-called roll-call circuit in the memory device. The conventional roll-call circuit includes a programmable element such as a polysilicon fuse and a current sink circuit connected to a predetermined input terminal. When the redundant cell array is used to replace the defective memory cell or cells of the normal memory cell array, the programmable element is programmed to a predetermined state to enable the current sink circuit. The enabled current sink circuit causes a leakage current flowing from the predetermined input terminal when a voltage outside the normal voltage range is applied to the predetermined input terminal. Thus, the state of the redundant cell array can be detected by the leakage current flowing into the predetermined input terminal.

The semiconductor memory having the aforementioned roll-call circuit of the prior art also examines the address using the redundant row or column in terms of the input leakage current measured. However, it takes 10 msecs or more for the existing tester to measure that input leakage current. In case the semiconductor memory has 512 rows and one redundant row, for example, it takes about 5 secs to locate the address of the reundancy row.

On the other hand, the functional test before shipping has to be accomplished under the most severe conditions, which are changed because the relations between the physical arrangement of the cell information and the address are changed by using the redundant cell array.

During the function test, therefore the address using the redundant cell array has to be examined, and the cost for the semiconductor memory is raised by the aforementioned long time taken for the test.

SUMMARY OF THE INVENTION

It is an object of the present invention to provide a semiconductor memory device having a redundant cell array in which the state of the redundant cell array can be detected at a high speed with ease.

The semiconductor memory device according to the present invention comprises a normal memory cell array, a redundant memory cell array for replacing a defective memory cell or cells in the normal memory cell array, a selection circuit for operatively selecting a memory cell of the normal memory cell array and the redundant memory cell array, an output circuit for operatively outputting read-out data from the selected memory cell to an output terminal, a detection circuit for generating a detection signal when the memory cell of the redundant memory cell array is selected, and a control circuit for disenabling the output circuit in response to the detection signal thereby to make the output terminal at a high impedance state.

According to the present invention, the actual selection of the memory cell of the redundant memory cell array can be detected by the state of the output terminal, namely by the high impedance state of the output terminal. Since it is easy to check the state of the output terminal at a high speed, the test time required to perform a function test can be reduced greatly.

BRIEF DESCRIPTION OF INVENTION

The above and further objects, features and advantages of the present invention will become more apparent from the following detailed description taken in conjunction with the accompanying drawings, wherein.

DETAILED DESCRIPTION OF THE INVENTION

Figure 1:
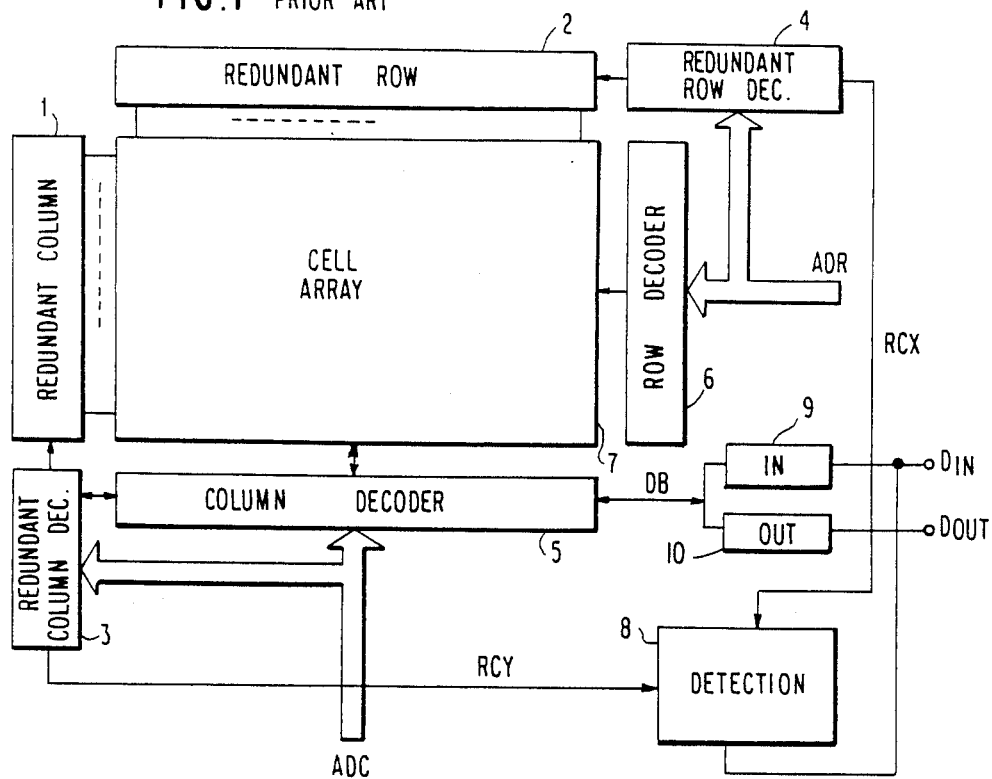
FIG. 1 is a schematic block diagram showing a semiconductor memory device in the prior art.
Figure 2:
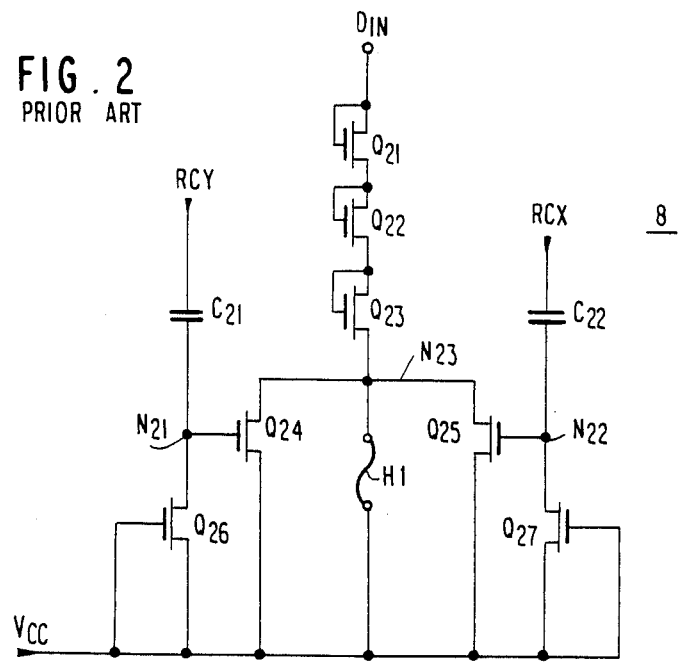
FIG. 2 is a schematic circuit diagram of a roll-call circuit employed in the memory device of FIG. 1 in the prior art.

Prior Art:

With reference to FIGS. 1 and 2, a semiconductor memory device having a redundant cell array in the prior art will be explained.

As shown in FIG. 1, the memory device comprises a normal memory cell array 7, a redundant memory cell array which is arranged as a redundant row of cell array 2 and a redundant column of cell array 1, a row decoder 6 for selecting one of the rows of the normal cell array 7 in accordance with row address signals ADR, a column decoder 5 for selecting one of columns of the normal cell array 7 to be connected to a data bus line DB in accordance with column address signals ADC, a redundant row decoder 4 for selecting the redundant row of cells 2 when one of the rows of the array 7 including a defective memory cell is addressed, a redundant column decoder 3 for selecting the redundant column of cells 1 when one of the columns of the normal array 7 including a defective memory cell is addressed, an input circuit 9, an output circuit 10, and a roll-call circuit 8 for indicating that the redundant row or redundant column is actually selected.

The redundant column decoder 3 the redundant row decoder 4 produces a redundant selection signal RCY or RCX when the redundant column 1 or the redundant row 2 is selected.

In this memory, after the defective portion has been shot, programmable elements such as fuses in the redundant row decoder 4 or the redundant column decoder 3 are programmed in accordance with the address of the defective portion. After this, if the address of defective portion is inputted, the redundant decoder inactivates the row decoder 6 or the column decoder 5 and selects the redundancy row (word line) 2 or the redundancy column (digit line) 1, in a well known way.

On the other hand, the semiconductor memory is accompanied by a parasitic capacitance or a parasitic resistance in addition to the elements in the circuit diagram in accordance with the physical arrangement of the wiring lines. This changes the operation characteristics in accordance with the physical arrangement of cell information. As a result, the function test of the semiconductor memory before shipping has to be accomplished with the physical arrangement of the cell information with the worst operation characteristics. In the semiconductor memory using the redundant circuit, however, the input address, the input data and the physical arrangement of the cell information are changed by the use of the redundant circuit. In the function test, therefore, it is necessary to know the address to be replaced by the redundant array. This address is examined by a roll-call circuit 8.

One example of the roll-call circuit 8 will be shown in FIG. 2.

The roll-call circuit 8 includes N-channel MOS transistors Q21–Q27 having a threshold voltage $V_{TN}$, a fuse H1 and capacitors C21 and C22.

The signals RCY and RCX from the redundant docoders 3 and 4 are applied to the capacitors C21 and C22. If the redundant circuit (the column 1 or the row 2) is used, the fuse H1 is cut. When the data input signal DIN is made higher than a supply voltage VDD by 3VTN or more, an input leakage current flows from the terminal DIN to the Vcc in case where the redundant array is unused. In case where the redundant array is used, the fuse is cut. For the DIN at (VDD+3VTN), therefore, a node N23 is at the VDD whereas nodes N21 and N22 are at the level of (VDD−VTN) so that the MOS transistors Q24 and Q25 are not turned on to pass no current. At the address selecting the redundant array, however, the signal RCY or RCX takes the high level to raise the N21 or the N22 to the level of (VDD+VTN) or more through capacitors C21 or C22 so that the transistors Q24 and Q25 are turned on to pass the input leakage current from the DIN to the VCC.

Thus, the address using the redundant array can be located through the DIN input leakage current.

The semiconductor memory of FIG. 1 having the aforementioned roll-call circuit 8 also examines the address using the redundant row or column in terms of the input leakage current measured. However, it takes 10 msecs or more for the existing tester to measure that input leakage current. In case the semiconductor memory has 512 rows and one redundant row, for example, it takes about 5 secs to locate the address of the redundancy row.

On the other hand, the functional test before shipping has to be accomplished under the most severe conditions, which are changed because the relations between the physical arrangement of the cell information and the address are changed by using the redundant cell array.

During the function test, therefore, the address using the redundant cell array has to be examined, and the cost for the semiconductor memory is raised by the aforementioned long time taken for the test. Embodiment:

The semiconductor memory device according to one preferred embodiment of the present invention will be explained with refrence to FIGS. 3 and 4.

Figure 3:
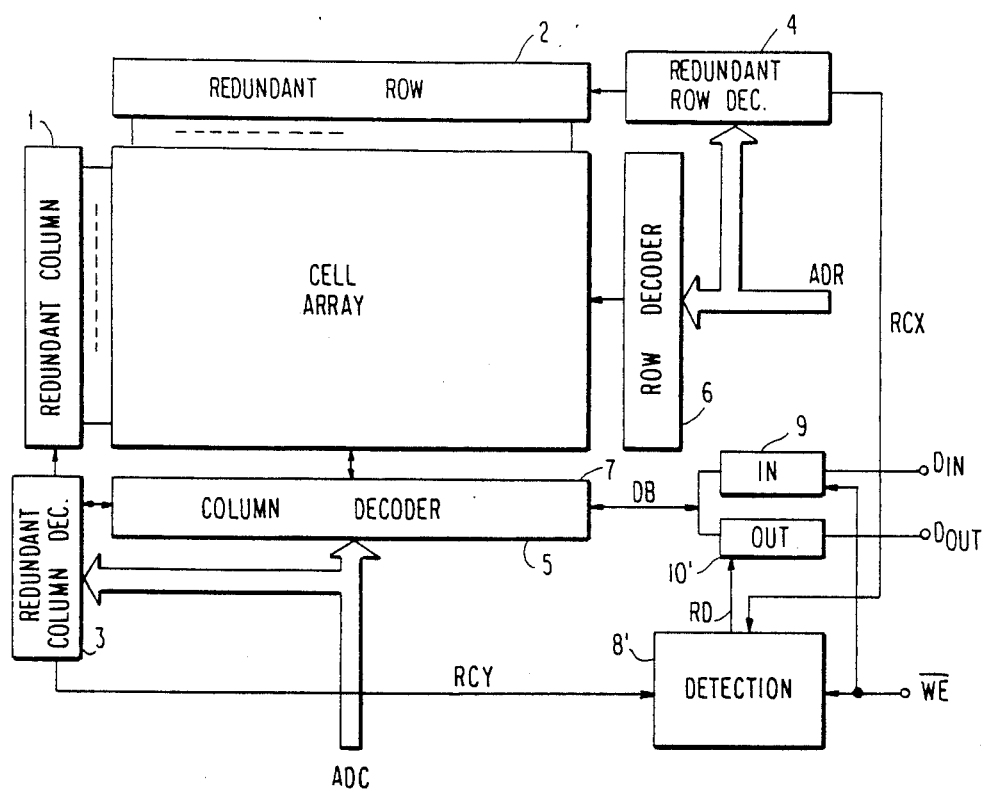
FIG. 3 is a schematic block diagram showing a semiconductor memory device according to one embodiment of the present invention.

FIG. 3 shows a block diagram of the memory device according to the embodiment. In FIG. 3, portions or blocks corresponding to those in FIG. 1 are denoted by the same or similar references.

The memory device according to this embodiment is featured in that an output signal RD of the roll-call circuit 8' is applied to the output circuit 10 and that the output $D_{OUT}$ of the output circuit 10' is rendered at a high impedance (floating) state in while, when the write enable signal $\overline{WE}$ is at the specified high level but lower than 10 $V_{TN}$, the node N1 of the roll-call circuit 8' is at the low level so that the roll-call circuit 8' is disenabled. Thus, the signal RD is kept at the low level so that the output circuit 10' simply generates read-out data at the terminal $D_{OUT}$.

As has been described hereinbefore, according to the present invention, the address using the redundant circuit can be examined in terms of the output data so that the time period for the function test can be shortened to drop the cost for the semiconductor memory response to the output signal RD. Namely, when the redundant cell array such as 1 or 2 is selected and the signal RCY or RCX is generated, the roll-call circuit 8' generates the signal RD when a write enable signal $\overline{WE}$ is at the level more than VCC. As a result, the output terminal $D_{OUT}$ is made at the high impedance state in response to the signal RD. This detection procedure is performed in a read mode and therefore, the output circuit 10' generates read data at $D_{OUT}$ unless the redundant array is selected.

Figure 4:
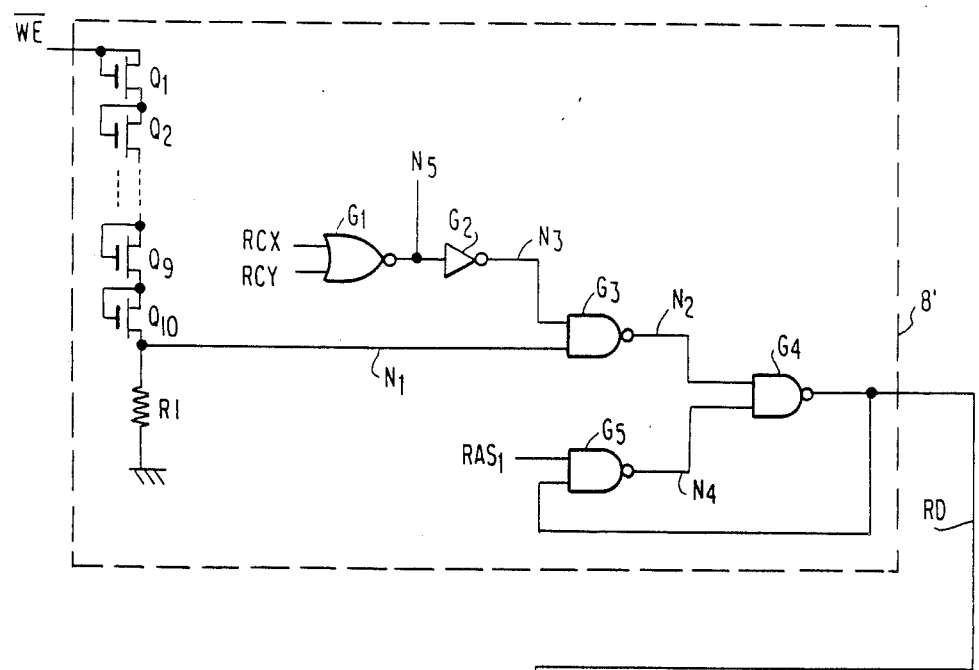
FIG. 4 is a schematic circuit diagram of the roll-call circuit and an output circuit employed in the memory device of FIG. 4.
Figure 4:
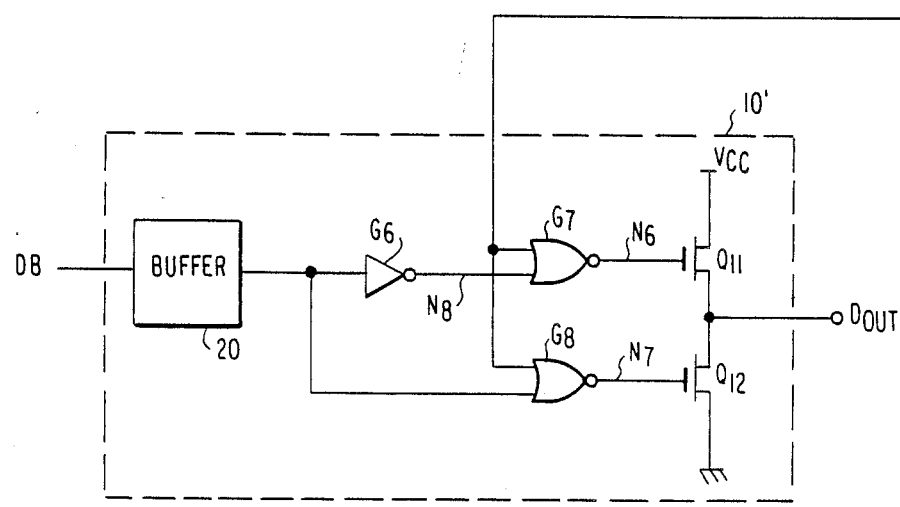

One detailed example of the roll-call circuit 8' and the output circuit 10' are shown in FIG. 4.

The roll-call circuit 8' includes N-channel MOS transistors Q1–Q10 and a resistor R1 connected in series between the write enable signal input $\overline{WE}$ and a ground potential, a NOR gate G1 receiving the signals RCX and RCY, an inverter G2, and NAND gates G3 to G5. A signal RAS1 applied to the input of the NAND gate G5 is such a signal that takes a high level when address received by the memory device is valid or the row decoder 6 or the redundant row decoder 4 is enabled.

The output circuit 10' includes a buffer 20 having an input connected to the data bus line 20 and, a tristate type push-pull circuit composed of an inverter G6, NOR gates G7 and G8 and N-channel output transistors Q11 and Q12.

In the output circuit 10', both of the transistors Q11 and Q12 are made non-conductive to make the output terminal $D_{OUT}$ at the high impedance state when the signal RD is at the high level because the output nodes N6 and N7 of the NOR gates are at a low level. While, the signal RD is not present, i.e. at the low level, the NOR gates produce true and complementary signals at the nodes in accordance with the level of DB to drive the transistors Q11 and Q12 in a complementary manner.

Whole operation of the memory device of FIGS. 3 and 4 will be explained.

In a read cycle, the write enable signal $\overline{WE}$ is made at the high level more than 10 $V_{TN}$ (sum of the threshold voltage of Q1 to Q10). Here, 10 $V_{TN}$ is equal to or higher than the specified high level of the $\overline{WE}$. As a result, the transistors Q1 to Q10 are made conductive to make a node N1 at a high level. Under this state of N1, when either of the signal RCX or RCY is made active, the output N2 of the NAND gate G3 becomes a low level so that the roll-call circuit 8' is enabled. If the read cycle is repeated while changing the address, a one-shot signal at the high level is fed from the redundant decoder 4 or 3 as RCX or RCY to the NOR gate G1. This one-shot signal is transmitted through the gates G1, G2 and G3 to the NAND gate G4. On the other hand, the signal RAS1 always takes the high level during one cycle in which the address is effective. If the RAS1 is at the high level, the signal RED of the high level is generated in response to a signal of a low level fed from the node N2 to the gate G4, and is mainteined until the RAS1 is changed to the low level. As a result, if the one-shot high level is once inputted as the RCX or RCY, the RED is always held at the high level so long as the address is not reset during the read cycle. The signal RED produced by the roll-call circuit 8' is fed to NOR gates G7 and G8 of the output circuit 10'. If this signal RED takes the high level, the outputs of both the gates G7 and G8 are dropped to the low level so that the data output $D_{OUT}$ comes into a high impedance state. This implies that the address being accessed uses the redundant array.

According to this embodiment, in the semiconductor memory having 512 word lines and one redundant row, the address of the redundant row can be examined for about 0.1 msecs if the minimum reading cycle is 200 nsecs.

I claim:

1. A semiconductor memory device comprising a normal array of normal memory cells, a redundant array of redundant memory cells, a selection circuit coupled to said normal array and said redundant array for operatively selecting one of said normal memory cells and said redundant memory cells in response to address data, an output terminal, an external terminal receiving a first voltage signal of a normal voltage range and a second voltage signal outside said normal range, a voltage detection circuit coupled to said external terminal, said voltage detection circuit generating a first control signal when said external terminal receives said first voltage signal and a second control signal when said external terminal receives said second voltage signal, an output circuit coupled to said selection circuit and said output terminal for operatively outputting data from the selected memory cell at said output terminal in a first mode and setting said output terminal at a predetermined state irrespective of read data from the selected memory cell in a second mode, a detection circuit coupled to said selection circuit for generating a detection signal when one of said redundant memory cells is selected by said address data, and a control circuit for setting said output circuit in said first mode in response to said first control signal and in said second mode when both said second control signal and detection signal are present.

2. The semiconductor memory device according to claim 1, in which said normal memory cells are arranged in a matrix form of rows and columns in said normal array and said redundant memory cells are arranged in parallel with at least one of row and column.

3. The semiconductor memory device according to claim 1, in which said predetermined state is a high impedance state.

4. A semiconductor memory device comprising a normal array of memory cells arranged in a matrix form of rows and columns, a redundant array of memory cells arranged in row and columns, a row selection circuit coupled to said normal array and said redundant array for selecting one of the rows of said normal array and said redundant array, a column selection circuit coupled to said normal array and said redundant array for selecting one of the columns of said normal array and said redundant array, an output terminal, an output circuit coupled to said column selection circuit for operatively outputting data derived from the selected column to said output terminal in a first mode and setting said output terminal at a predetermined state in a second mode, an external terminal receiving a first voltage signal of a normal voltage range and a second voltage signal outside said normal voltage range, and a detection circuit for generating a detection signal when the row of said redundant array is selected, and a control circuit setting said output circuit in said first mode when said external terminal receives said first voltage signal and in said second mode only when said external terminal receives said second voltage signal and said detecting signal is generated.

* * * * *